(12) United States Patent
Lv et al.

(10) Patent No.: US 10,944,083 B2
(45) Date of Patent: Mar. 9, 2021

(54) ARRAY SUBSTRATE, METHOD FOR MANUFACTURING ARRAY SUBSTRATE, AND DISPLAY PANEL

(71) Applicants: BOE Technology Group Co., Ltd., Beijing (CN); Chengdu BOE Optoelectronics Technology Co., Ltd., Chengdu (CN)

(72) Inventors: Chong Lv, Beijing (CN); Fuqiang Tang, Beijing (CN); Xiaonan Liu, Beijing (CN); Yihong Zeng, Beijing (CN); Ruinan Song, Beijing (CN); Fujiang Jin, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 157 days.

(21) Appl. No.: 16/162,013

(22) Filed: Oct. 16, 2018

(65) Prior Publication Data

US 2019/0288243 A1 Sep. 19, 2019

(30) Foreign Application Priority Data

Mar. 13, 2018 (CN) .......................... 201810204632.8

(51) Int. Cl.
*H01L 51/56* (2006.01)
*H01L 21/78* (2006.01)
(Continued)

(52) U.S. Cl.
CPC .......... *H01L 51/56* (2013.01); *H01L 21/0274* (2013.01); *H01L 21/78* (2013.01);
(Continued)

(58) Field of Classification Search
CPC ............. H01L 27/1218; H01L 27/1262; H01L 27/1288; H01L 21/78; H01L 51/0096; H01L 51/0097; H01L 2251/566
See application file for complete search history.

(56) References Cited

U.S. PATENT DOCUMENTS 10,566,394 B2 2/2020 Cai
2014/0117342 A1\* 5/2014 Kwon ................. H01L 27/3244
257/40

(Continued)

FOREIGN PATENT DOCUMENTS

CN 205609526 U 9/2016
CN 107068715 A 8/2017

OTHER PUBLICATIONS

Wikipedia contributors, 'Photolithography', Wikipedia, The Free Encyclopedia, <https://en.wikipedia.org/w/index.php?title=Photolithography&oldid=969818752> [archived Nov. 17, 2017] (Year: 2017).*

(Continued)

*Primary Examiner* — Zandra V Smith
*Assistant Examiner* — Molly K Reida
(74) *Attorney, Agent, or Firm* — Westman, Champlin & Koehler, P.A.

(57) ABSTRACT

A method for manufacturing an array substrate, an array substrate and a display panel are provided herein. The method for manufacturing the array substrate includes: forming an inorganic layer on a base substrate; defining a preset region in a marginal region of the base substrate, and removing the inorganic layer in the preset region; and cutting the base substrate or the base substrate together with one or more layers on the base substrate in the preset region.

19 Claims, 3 Drawing Sheets

(51) Int. Cl.
*H01L 27/32* (2006.01)
*H01L 21/027* (2006.01)
*H01L 27/12* (2006.01)
*H01L 51/52* (2006.01)

(52) U.S. Cl.
CPC ...... *H01L 27/1262* (2013.01); *H01L 27/1288* (2013.01); *H01L 51/5253* (2013.01); *H01L 27/3244* (2013.01); *H01L 2227/323* (2013.01); *H01L 2251/5338* (2013.01); *H01L 2251/566* (2013.01)

(56) References Cited

U.S. PATENT DOCUMENTS

| 2015/0034935 A1* | 2/2015 | Choi ................ H01L 51/5253 257/40 |
| 2015/0036299 A1 | 2/2015 | Namkung et al. |
| 2018/0061910 A1 | 3/2018 | Cai |

OTHER PUBLICATIONS

First Office Action, including Search Report, for Chinese Patent Application No. 201810204632.8, dated Mar. 16, 2020, 12 pages.

\* cited by examiner

ARRAY SUBSTRATE, METHOD FOR MANUFACTURING ARRAY SUBSTRATE, AND DISPLAY PANEL

CROSS-REFERENCE TO RELATED APPLICATION

This application claims priority of Chinese Patent Application No. 201810204632.8 filed on Mar. 13, 2018 in the State Intellectual Property Office of China, the disclosure of which is incorporated herein by reference in entirety.

TECHNICAL FIELD

Embodiments of the present disclosure relate to the field of display technology, and in particular, to an array substrate, a method for manufacturing an array substrate, and a display panel.

BACKGROUND

OLED (Organic Light Emitting Diode) has been more and more widely used due to its low power consumption, fast response speed, large viewing angle, high contrast ratio, and so on.

SUMMARY

A method for manufacturing an array substrate, comprising:

forming an inorganic layer on a base substrate;

defining a preset region in a marginal region of the base substrate, and removing the inorganic layer in the preset region; and cutting the base substrate or the base substrate together with one or more layers on the base substrate in the preset region.

According to an embodiment of the present disclosure, the step of removing the inorganic layer in the preset region comprises:

applying resist on the inorganic layer;

exposing and developing the inorganic layer coated with the resist to remove the resist in the preset region; and etching the inorganic layer by using a mask formed by the resist remaining in a non-preset region, to remove the inorganic layer in the preset region.

According to an embodiment of the present disclosure, the step of removing the inorganic layer in the preset region comprises:

forming an insulation layer on the inorganic layer, and applying resist on the insulation layer;

exposing and developing the insulation layer coated with the resist to remove the resist in the preset region; and sequentially etching the insulation layer and the inorganic layer by using a mask formed by the resist remaining in a non-preset region, to remove the inorganic layer in the preset region.

According to an embodiment of the present disclosure, the step of removing the inorganic layer in the preset region comprises:

sequentially forming an insulation layer and a thin film encapsulation layer on the inorganic layer, and applying resist on the thin film encapsulation layer;

exposing and developing the thin film encapsulation layer coated with the resist to remove the resist in the preset region; and sequentially etching the thin film encapsulation layer, the insulation layer and the inorganic layer by using a mask formed by the resist remaining in a non-preset region, to remove the inorganic layer in the preset region.

According to an embodiment of the present disclosure, the inorganic layer comprises an interfacial barrier layer formed on the base substrate and a buffer layer formed on a side of the interfacial barrier layer away from the base substrate.

According to an embodiment of the present disclosure, the insulation layer comprises a plurality of barrier dams and an anti-cracking dam disposed at an end of the insulation layer, and a patterning process of the barrier dams and the anti-cracking dam and the removal of the inorganic layer in the preset region are accomplished by one same process.

According to an embodiment of the present disclosure, the anti-cracking dam is located at an outer side of the plurality of barrier dams, and gaps are respectively provided between adjacent ones of the plurality of barrier dams and between the anti-cracking dam and the barrier dam adjacent thereto.

According to an embodiment of the present disclosure, the preset region is a region between a boundary of the base substrate and a boundary of the anti-cracking dam.

According to an embodiment of the present disclosure, the etching the insulation layer and the etching the inorganic layer are accomplished in a same process step; or wherein the etching the insulation layer and the etching the inorganic layer are accomplished in different process steps.

According to an embodiment of the present disclosure, the etching the thin film encapsulation layer, the etching the insulation layer and the etching the inorganic layer are accomplished in a same process step; or wherein the etching the thin film encapsulation layer, the etching the insulation layer and the etching the inorganic layer are accomplished in different process steps.

According to an embodiment of the present disclosure, the applying the resist on the inorganic layer comprises forming a resist layer having a uniform and flat upper surface by a spin coating process.

According to an embodiment of the present disclosure, the resist is positive or negative resist.

According to an embodiment of the present disclosure, the cutting the base substrate or the base substrate together with one or more layers on the base substrate comprises cutting the base substrate or the base substrate together with one or more layers on the base substrate by using laser.

According to an embodiment of the present disclosure, the cutting the base substrate or the base substrate together with one or more layers on the base substrate comprises cutting the base substrate or the base substrate together with one or more layers on the base substrate along a new side edge of the inorganic layer formed after the inorganic layer in the preset region is removed.

According to an embodiment of the present disclosure, the method further comprises: sequentially forming a first polyimide alignment film, a first interfacial barrier layer and a second polyimide alignment film on the base substrate by a sputtering or vapor deposition process before forming the inorganic layer on the base substrate.

According to an embodiment of the present disclosure, the insulation layer comprises a plurality of barrier dams and an anti-cracking dam disposed at an end of the insulation layer, and a patterning process of the barrier dams and the anti-cracking dam and the removal of the inorganic layer in the preset region are accomplished by one same process.

According to an embodiment of the present disclosure, the anti-cracking dam is located at an outer side of the plurality of barrier dams, and gaps are respectively provided between adjacent ones of the plurality of barrier dams and between the anti-cracking dam and the barrier dam adjacent thereto.

According to an embodiment of the present disclosure, the preset region is a region between a boundary of the base substrate and a boundary of the anti-cracking dam.

According to another aspect of the present disclosure, there is provided an array substrate, manufactured by the method for manufacturing the array substrate according to any one of the above embodiments.

According to a further aspect of the present disclosure, there is provided a display panel, comprising the array substrate according to any one of the above embodiments.

DETAILED DESCRIPTION OF EMBODIMENTS

The present disclosure will be further described with reference to the accompanying drawings and the exemplary embodiments, herein the same or similar reference numerals refer to the same or similar component. The embodiments described below with reference to the accompanying drawings are intended to be only illustrative of the present disclosure, but are not to be construed as limiting the present disclosure.

Compared with the manufacturing process of a flat OLED device, a flexible OLED device is manufactured through additional process steps, such as a substrate process, a packaging process, a cutting process and the like. In the manufacture of the flexible OLED device, a plastic substrate is generally used as a flexible substrate, and upper and lower interfaces of the plastic substrate comprise inorganic buffer layers to match stresses between the flexible substrate and a display device, furthermore, the inorganic buffer layer can improve sealing performance of the OLED device.

Figure 1:
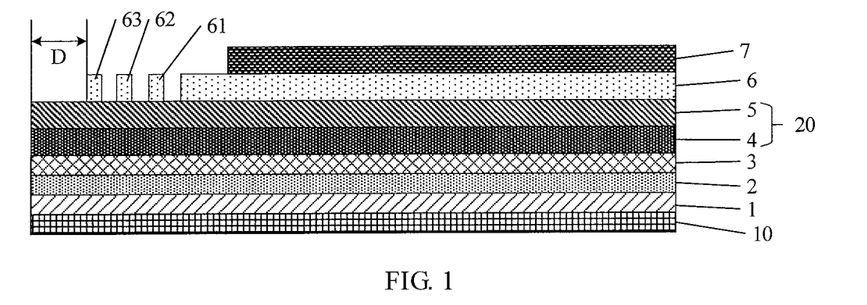
FIG. 1 is a schematic view showing a marginal structure of an array substrate.

The marginal structure of the array substrate is as shown in FIG. 1. The array substrate may include: a base substrate 10; a first PI alignment film 1 on the base substrate 10; a first interfacial barrier layer 2 on the first PI alignment film 1; a second PI alignment film 3 on the first interfacial barrier layer 2; a second interfacial barrier layer 4 on the second PI alignment film 3; a buffer layer 5 on the second interfacial barrier layer 4; an insulation layer 6 on the buffer layer 5; and a thin film encapsulation layer on the insulation layer 6. The second interfacial barrier layer 4 and the buffer layer 5 constitute an inorganic layer 20. Regarding the specific structure of the insulation layer 6, reference may be made to the description of the following embodiments.

After the array substrate is manufactured, it is generally necessary to cut off excess materials in a boundary of the array substrate to form a regular border and reduce the size of the substrate. Cutting off excess marginal region D of the array substrate is usually performed by cutting the array substrate using a laser cutting process one time, herein the laser cutting refers to that the substrate is allowed to absorb a specific band of laser energy so that it is ablated and cut off. When the laser cutting is performed, the inorganic layer needs to be cut off, and it is possible to cut a stress concentration point of the inorganic layer, so that microcracks are generated in the inorganic layer, thereby affecting the performance of the OLED device and even causing failure of the OLED device.

Embodiments of the present disclosure are intended to provide an array substrate, a method for manufacturing the same, and a display panel, to at least partially solve the problem that cracks are easily formed in the inorganic layer when the array substrate is cut.

Figure 2:
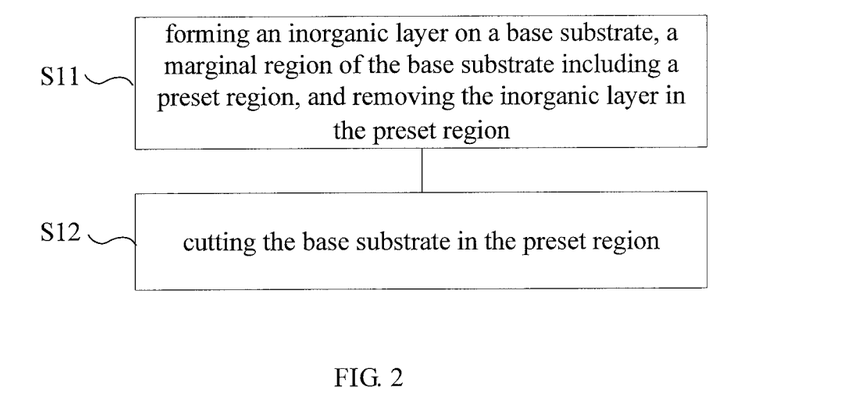
FIG. 2 is a schematic flow chart of a method for manufacturing an array substrate according to an embodiment of the present disclosure.

As shown in the schematic flow chart of FIG. 2, a method for manufacturing an array substrate according to an embodiment of the present disclosure includes:

S11: forming an inorganic layer on a base substrate, a marginal region of the base substrate including a preset region, and removing the inorganic layer in the preset region.

The inorganic layer is formed on the base substrate by a deposition process, such as a vapor deposition process, and the base substrate may be chosen from a glass substrate or a flexible substrate. A width of the preset region is related to precision of laser cutting and cutting heat. The width of the preset region may be greater than the cutting precision of the laser cutting. As an example, the width of the preset region is greater than 50 μm, for example, the width may be 80 μm, 90 μm, 100 μm or other values.

Further, before forming the inorganic layer on the base substrate, the method further includes:

sequentially forming a first PI (polyimide) alignment film, a first interfacial barrier layer, and a second PI alignment film on the base substrate by a deposition process such as a sputtering or vapor deposition process.

In one embodiment, the inorganic layer includes an interfacial barrier layer and a buffer layer laminated on the base substrate. To distinguish from the first interfacial barrier layer, the interfacial barrier layer in the inorganic layer is referred to as a second interfacial barrier layer. The step of manufacturing the inorganic layer includes: depositing the second interfacial barrier layer on the base substrate, and then forming the buffer layer on a side of the second interfacial barrier layer away from the base substrate. The forming the buffer layer on the second interfacial barrier layer may be performed by a sputtering process, a vapor deposition process or the like.

Generally, the border of the array substrate is processed in a "one-cut" way, that is, the entire cutting operation is performed by one-time cutting in one cutting process regardless of the materials of the array substrate. During the practical application, the inventor(s) found that cracks are most readily generated in the inorganic layer and the cracks readily diffuse to other layers during the cutting process due to affection from the precision of the laser cutting and the generated heat. Therefore, it is proposed to complete the process of removing the marginal region of the array substrate in two steps, i.e., the inorganic layer which is most likely to form cracks is firstly removed, and then basic layers underlying the inorganic layer are cut.

In the embodiment of the present disclosure, a region in the marginal region of the base substrate that needs to be removed is set as a preset region. In an alternative embodiment, the inorganic layer in the preset region is removed by an etching process, in one example the inorganic layer in the preset region is removed along an edge of the inorganic layer by the etching process; herein the region where the inorganic layer needs to be removed is referred to as the preset region. The width of the preset region may be set according to actual needs, but it should be greater than the cutting precision. An etching process may be used to remove the inorganic layer, for example a dry etching process or a wet etching process may be used to remove the inorganic layer. The inorganic layer is stripped off by solutions, reactive ions, plasmas or the like, the etching process only affects the etched boundary, but will not generate external stress on the inorganic layer. The wet etching process is a pure chemical reaction process, and the dry etching process also includes a chemical etching process. Herein, the selectivity for etching is wide, and it will not affect non-etched regions.

S12: cutting the base substrate in the preset region.

After the inorganic layer in the preset region is removed, the substrate underlying the inorganic layer is cut along a new side edge of the inorganic layer formed after the inorganic layer in the preset region is removed. The cutting method may be selected to be the laser cutting. That is, the substrate is irradiated with a laser beam along the new side edge of the inorganic layer to cut the portion of the substrate between the new side edge and the side edge region of the substrate.

In the embodiment of the present disclosure, the removal process is performed in two parts. The inorganic layer in the preset region is firstly removed, after that, the substrate underlying it is cut so that the inorganic layer is avoided from the affection of stresses or heat generated by the cutting process, thereby further reducing the possibility of generating cracks. The array substrate that is cut can meet market demand of narrow bezel, thereby realizing the purpose of no border in practice.

Further, after removing the inorganic layer in the preset region, the method further includes: removing the resist remaining in the preset region. The resist acts as a mask during the etching process, and after the etching process is completed, the residual resist is removed for subsequent process steps.

Figure 3:
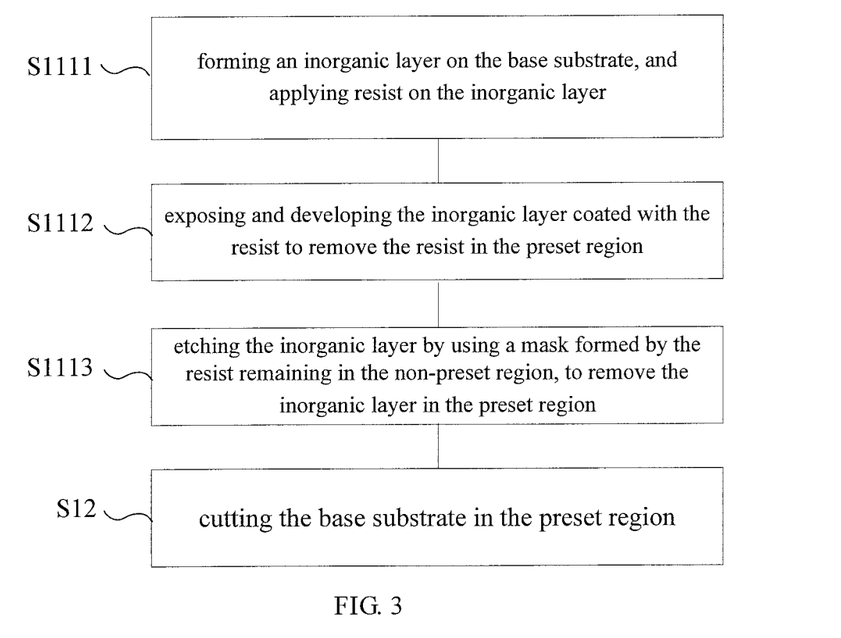
FIG. 3 is a schematic flow chart of a method for manufacturing an array substrate according to an embodiment of the present disclosure.

As shown in the schematic flow chart of FIG. 3, an embodiment of the present disclosure includes:

S1111: forming an inorganic layer on the base substrate, and applying resist on the inorganic layer.

The inorganic layer is formed on the base substrate by a deposition process, such as a vapor deposition process or the like, and the base substrate may be a flexible base substrate. The resist is applied on the inorganic layer, for example by a spin coating process to form a resist layer having a uniform and flat upper surface, so as to facilitate subsequent exposing, developing and etching processes. The resist may be a positive resist including a resin material and an organic solvent or the like, or a negative resist including a negative photoresist or the like.

S1112: exposing and developing the inorganic layer coated with the resist to remove the resist in the preset region.

Steps of exposing and developing the inorganic layer coated with the resist include exposing and developing the formed resist layer by using a reticle, and the exposing step may be performed by electron beams or ultraviolet rays, and may be a contact type or a non-contact type. The exposing conditions of the preset region are related to the resist to be selected. If the resist is positive; then the preset region is a full exposure region, and the region other than the preset region (i.e., the non-preset region) is not exposed (called as a non-exposed region). After exposing, the resist in the preset region becomes more soluble in a developing liquid, and can be removed during the development, only leaving the resist in the non-preset region. If the resist is negative, then the preset region is a non-exposed region, and the region other than the preset region (i.e., non-preset region) is a full exposure region. The resist of the full exposure region absorbs energy of the lights to cause a polymer chain reaction in which polymer molecules crosslink so that the resist becomes difficult to be dissolved in the developing liquid. The negative resist in the preset region is not exposed, and fails to absorb the energy of the lights to cause the polymer chain reaction, thus it is easily dissolved in the developing liquid. Therefore, the resist in the preset region is removed during the development, and the resist in the non-preset region is also retained.

S1113: etching the inorganic layer by using a mask formed by the resist remaining in the non-preset region, to remove the inorganic layer in the preset region.

The inorganic layer may be etched by using the mask formed by the resist remaining in the non-preset region in a dry etching process or a wet etching process. Taking a plasma etching in the dry etching as an example, the gas exposed to a region where the electrons are located forms plasmas, and the resulting ionized gas and the gas that discharges high-energy electrons form plasmons or ions. The atoms of the ionized gas are accelerated by an electric field to bombard or sputter the etched layer, i.e., a surface of the inorganic layer without the resist, so that a volatile substance is generated, then the volatile substance generated during the reaction is pumped away by a vacuum pump, thereby achieving the purpose of removing the inorganic layer in the preset region.

The technique of transferring a pattern on a reticle to a substrate by means of resist under illumination from such lights refers to a photolithography technique. The removal of the inorganic layer in the preset region by photolithography technique has high removal precision, and it would not generate additional heat and stress during the removal process, thereby applying no adverse affections to other device layers. And as for the step of removing the inorganic layer directly after the inorganic layer is formed, it avoids the affection on the device layers above the inorganic layer when the inorganic layer in the preset region is removed. Once a mistake or an error occurs during the removal process, it is no longer necessary to perform the subsequent steps, thereby reducing waste of resources.

Figure 4:
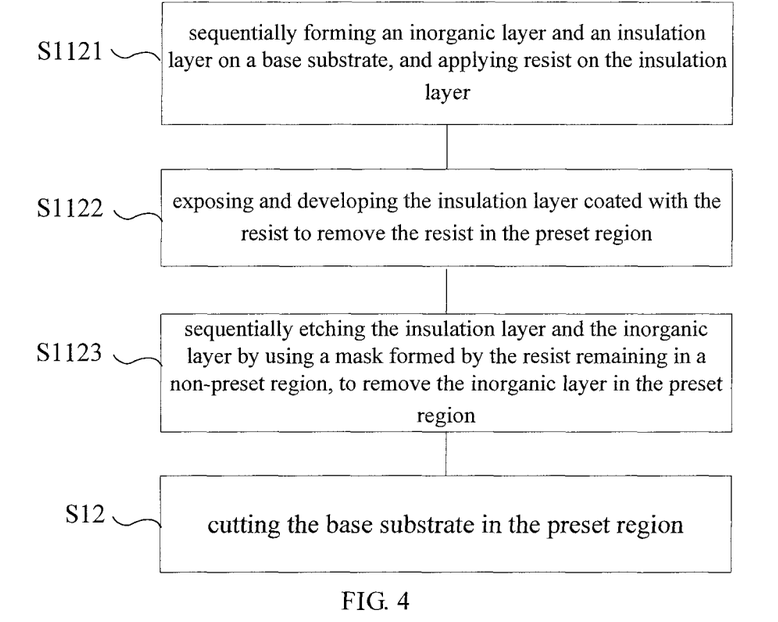
FIG. 4 is a schematic flow chart of a method for manufacturing an array substrate according to an embodiment of the present disclosure.

Another embodiment of the present disclosure is provided, as shown in the schematic flow chart of FIG. 4. The difference between this embodiment and the foregoing embodiment lies in that the step of removing the inorganic layer in the preset region includes:

S1121: sequentially forming an inorganic layer and an insulation layer on a base substrate, and applying resist on the insulation layer.

The inorganic layer is formed on the base substrate by a deposition process, such as a vapor deposition process or the like, and the insulation layer is deposited on the inorganic layer by any one of a sputtering process, a vapor deposition process and any other deposition processes. The insulation layer includes an interlayer insulation layer in direct contact with the inorganic layer and a gate oxide layer formed on the interlayer insulation layer. The interlayer insulation layer not only has an insulation effect, but also blocks external moisture and mechanical scratches.

Figure 6:
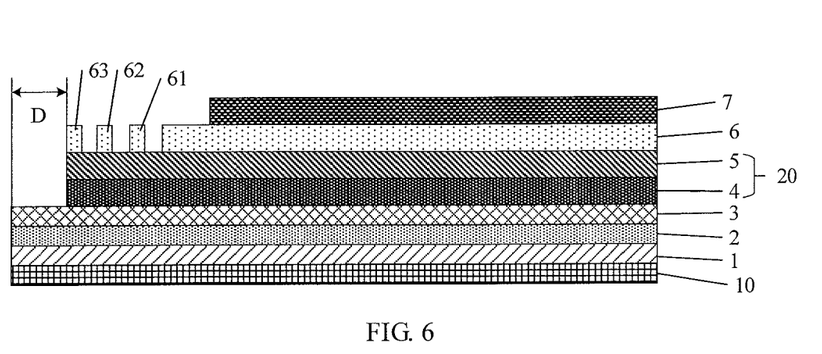
FIG. 6 is a schematic structural view of an array substrate according to an embodiment of the present disclosure.

The insulation layer further includes several barrier dams and one anti-cracking dam 63 disposed at one end of the insulation layer, and gaps are respectively provided between adjacent ones of the several barrier dams and between the anti-cracking dam and the barrier dam adjacent thereto. The regions consisted of the barrier dams, the anti-cracking dam and the gaps are referred to as a barrier dam region. As shown in FIG. 6, the barrier dams include a first barrier dam (Dam1) 61 and a second barrier dam (Dam2) 62, wherein the first barrier dam and the second barrier dam function blocking the flow of an organic layer in a thin film encapsulation film, and the anti-cracking dam functions preventing the cracks, which are generated when the edge is cut, from extending inwardly. It is necessary for the width of the barrier dam region to be greater than 50 μm, for example the width of the barrier dam region may be 60 μm, and the sum of the width of the barrier dam region and the width of the preset region needs to be greater than 140 μm, so as to meet cutting requirements. The number of the anti-cracking dams and the number of the barrier dams may be adjusted according to actual conditions, only three dams are shown in FIG. 6, but it is not considered as a limitation to the number of the anti-cracking dams or the barrier dams. As an example, a patterning process of the barrier dams and the anti-cracking dam and the removal of the inorganic layer in the preset region may be accomplished by one same process, that is, the insulation layer coated with the resist is exposed and developed to remove the resist in the preset region and the gap region between adjacent ones of the several barrier dams and between the anti-cracking dam and the barrier dam adjacent thereto; the insulation layer and the inorganic layer are sequentially etched by using the mask formed by the residual resist to remove the inorganic layer in the preset region, while achieving the patterning process of the barrier dams and the anti-cracking dam and simplifying the processes.

In this embodiment, the preset region is a region between a boundary of the base substrate and a boundary of the anti-cracking dam, and the reference numeral D in FIG. 6 represents the range of the preset region.

Similarly, the base substrate may be chosen from a flexible base substrate, and the resist is applied on the insulation layer to form a resist layer having a uniform and flat upper surface on the insulation layer for facilitating subsequent processes, such as exposing, developing, etching and any other processes. The resist may be positive including a resin material and an organic solvent or the like, or negative including a negative photoresist or the like.

S1122: exposing and developing the insulation layer coated with the resist to remove the resist in the preset region.

Exposing and developing the insulation layer coated with the resist include exposing and developing the formed resist layer by using a reticle formed by the resist, and the exposing may be performed by electron beams or ultraviolet rays, and may be a contact type or a non-contact type. The exposing conditions of the preset region are related to the selected resist. If the resist is positive, then the preset region is a full exposure region, and the region other than the preset region (i.e., the non-preset region) is a non-exposed region. After the exposing, the resist in the preset region becomes more soluble in a developing liquid, and can be removed during the development, only leaving the resist in the non-preset region. If the resist is negative, then the preset region is a non-exposed region, and the region other than the preset region (i.e., the non-preset region) is a full exposure region. The resist of the full exposure region absorbs energy of the lights to cause a polymer chain reaction in which polymer molecules crosslink so that the resist becomes difficult to be dissolved in the developing liquid. The negative resist in the preset region is not exposed, and fails to absorb the energy of the lights to cause the polymer chain reaction, thus it is easily dissolved in the developing liquid. Therefore, the resist in the preset region is removed during the development, and the resist in the non-preset region is also retained.

S1123: sequentially etching the insulation layer and the inorganic layer by using a mask formed by the resist remaining in a non-preset region, to remove the inorganic layer in the preset region.

The preset region is a region between a boundary of the insulation layer (i.e., a boundary of the anti-cracking dam) and the boundary of the base substrate, that is, the reference numeral D in FIG. 6 represents the range of the preset region. Herein, this embodiment is the same as the previous embodiment in terms of etching process and principle. Firstly, the insulation layer may be etched by using the mask formed by the resist remaining in the non-preset region, to remove the insulation layer in the preset region and expose the inorganic layer underlying the insulation layer, and then the inorganic layer may be etched by using the mask formed by the resist remaining in the non-preset region. The "etching" herein may be performed by a dry etching process or a wet etching process, which will not be limited in the present disclosure. The etching process is the same as that of the previous embodiment, therefore the details will not be described herein again.

In the solution described in this embodiment, the marginal region of the inorganic layer is removed after the insulation layer has been formed. If cracks are generated in the array substrate during the etching process, it is unnecessary to perform the subsequent processes, thereby reducing waste of materials in the subsequent processes. Moreover, after the insulation layer is formed, it is convenient to determine the width of the preset region to be etched. In the removal process of the insulation layer and the inorganic layer by photolithography technique, it would not generate additional heat and stress, thereby the possibility of cracks in the array substrate is reduced, the photolithography process is simple, and the production costs are reduced.

Figure 5:
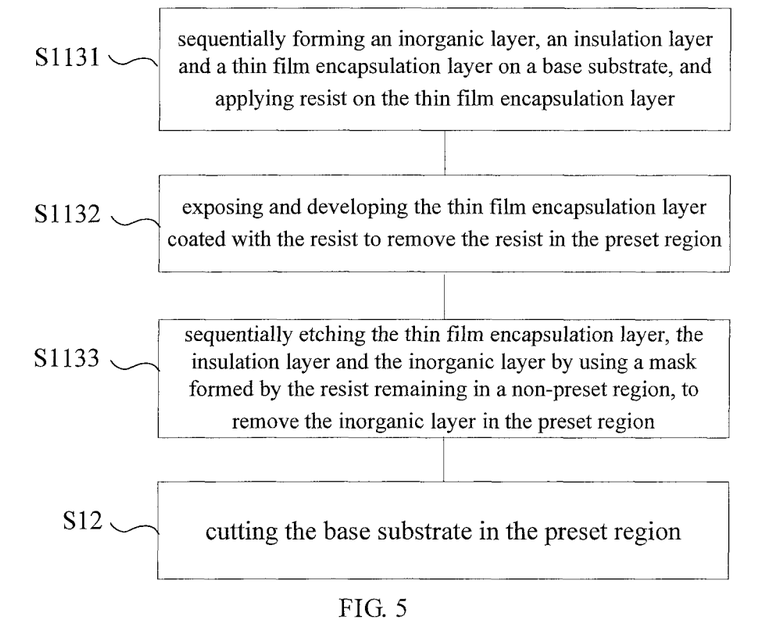
FIG. 5 is a schematic flow chart of a method for manufacturing an array substrate according to an embodiment of the present disclosure.

Another embodiment of the present disclosure is provided, as shown in the schematic flow chart of FIG. 5. The difference between this embodiment and the foregoing embodiment lies in that the step of removing the inorganic layer in the preset region includes:

S1131: sequentially forming an inorganic layer, an insulation layer and a thin film encapsulation layer on a base substrate, and applying resist on the thin film encapsulation layer.

The inorganic layer is formed on the base substrate by a deposition process, such as a vapor deposition process or the like, and the insulation layer is deposited on the inorganic layer by any one of a sputtering process, a vapor deposition process and any other deposition processes, and then the thin film encapsulation layer is formed on the insulation layer by a deposition process. The thin film encapsulation layer (TFE) is configured to protect the OLED element from the external environment, and it is corrosion-resistant.

Similarly, the base substrate may be chosen from a flexible base substrate, and the resist is applied on the thin film encapsulation layer to form a resist layer having a uniform and flat upper surface on the thin film encapsulation layer for subsequent processes, such as exposing, developing, etching and any other processes. The resist may be positive including a resin material and an organic solvent or the like, or negative including a negative photoresist or the like.

S1132: exposing and developing the thin film encapsulation layer coated with the resist to remove the resist in the preset region.

Exposing and developing the thin film encapsulation layer coated with the resist include exposing and developing the formed resist layer by using a reticle formed by the resist, and the exposing may be performed by electron beams or ultraviolet rays, and may be a contact type or a non-contact type. The exposing conditions of the preset region are related to the selected resist. If the resist is positive, then the preset region is a full exposure region, and the region other than the preset region (i.e., the non-preset region) is a non-exposed region. After the exposing, the resist in the preset region becomes more soluble in a developing liquid, and can be removed during the development, only leaving the resist in the non-preset region. If the resist is negative, then the preset region is a non-exposed region, and the region other than the preset region (i.e., the non-preset region) is a full exposure region. The resist of the full exposure region absorbs energy of the lights to cause a polymer chain reaction in which polymer molecules crosslink so that the resist becomes difficult to be dissolved in the developing liquid. The negative resist in the preset region is not exposed, and fails to absorb the energy of the lights to cause the polymer chain reaction, thus it is easily dissolved in the developing liquid. Therefore, the resist in the preset region is removed during the development, and the resist in the non-preset region is also retained.

S1133: sequentially etching the thin film encapsulation layer, the insulation layer and the inorganic layer by using a mask formed by the resist remaining in a non-preset region, to remove the inorganic layer in the preset region.

Similarly, the preset region in this embodiment is a region between the boundary of the base substrate and the boundary of the anti-cracking dam. Herein, this embodiment is the same as the previous embodiment in terms of etching process and principle. Firstly, the thin film encapsulation layer may be etched by using the mask formed by the resist remaining in the non-preset region, to remove the thin film encapsulation layer in the preset region and expose the insulation layer underlying the thin film encapsulation layer, and then the insulation layer may be etched by using the mask formed by the resist remaining in the non-preset region, to remove the insulation layer in the preset region and expose the inorganic layer underlying the insulation layer, and then the inorganic layer may be etched by using the mask formed by the resist remaining in the non-preset region. Further, the thin film encapsulation layer in the non-preset region may be etched according to actual needs to form a structure as shown in FIG. 6. As in the previous embodiment, the patterning process of the barrier dams and the anti-cracking dam in the insulation layer and the removal of the inorganic layer in the preset region may be for example accomplished by one same process. The "etching" in this embodiment may be performed by a dry etching process or a wet etching process, which will not be limited in the present disclosure. The etching process is the same as that of the previous embodiment, therefore the details will not be described herein again.

In the solution described in this embodiment, the marginal region of the inorganic layer is removed after the thin film encapsulation layer has been formed. The removal of the insulation layer and the inorganic layer by photolithography technique has high precision, and it would not generate additional heat and stress during the removal process, thereby reducing the possibility of generating cracks in the array substrate. Moreover, the region (shadow) having unstable film thickness which is generated during the formation of the thin film encapsulation layer by the deposition process may be etched away, and the photolithography adopted in this process is simple and it can reduce production costs. Moreover, in this solution, the cutting process of the inorganic layer is added behind the conventional manufacturing processes of the array substrate, therefore it does not destroy the performance of the original manufacturing processes, and has good compatibility with the original manufacturing processes.

Accordingly, an embodiment of the present disclosure further provides an array substrate, the structure of which is shown in FIG. 6, including a base substrate and an inorganic layer, an insulation layer and a thin film encapsulation layer laminated on the base substrate. The insulation layer includes several barrier dams and an anti-cracking dam disposed at one end of the insulation layer.

It is obvious that the array substrate according to the embodiment of the present disclosure may also be manufactured by the method for manufacturing the array substrate according to any one of the above technical solutions.

Accordingly, an embodiment of the present disclosure further provides a display panel including the above array substrate. In addition, an embodiment of the present disclosure further provides a display device including the display panel according to any one of the above technical solutions. The display device may be an electronic paper, an OLED panel, a mobile phone, a tablet computer, a television, a display, a notebook computer, a digital frame, a navigator or any other product or components having a display function.

Since the display panel and the display device are both achieved on the basis of the array substrate, the display panel and the display device naturally have all the advantages of the array substrate.

In summary, in the array substrate and the method for manufacturing the same according to the embodiments of the present disclosure, the marginal region of the array substrate is removed by two processes. Firstly, the inorganic layer in the preset region in the marginal region is removed by a photolithography process, and then the preset region is cut to remove a part of the marginal region of the base substrate underlying it. In this way, it avoids cracks which are caused by the cutting stresses and the heat generated by the cutting process when the inorganic layer is cut by the laser in the conventional process, and the photolithography process can accurately control cutting boundary, and therefore it can improve the cutting precision of the inorganic layer, reduce the risk of cracks of the inorganic layer which is prone to cracking, and improve the yield of product.

In the method for manufacturing the array substrate according to the embodiment of the present disclosure, the boundary of the inorganic layer is removed by a photolithography process. Since the process of cutting the inorganic layer by the photolithography process does not generate heat, it has no stress affection on non-cut regions, thereby avoiding cracks which are caused by the cutting stresses and the heat generated by the cutting process when the inorganic layer is cut by the laser in the conventional process, and the photolithography process can accurately control cutting boundary, and therefore it can improve the cutting precision of the inorganic layer.

In the method for manufacturing the array substrate according to the embodiment of the present disclosure, removal process of the inorganic layer is performed right after the inorganic layer is formed, or the removal process of the boundary region of the inorganic layer is performed after the insulation layer is formed, thereby avoiding the affection on the device layers above the inorganic layer when the inorganic layer in the preset region is removed. Once a mistake or an error occurs during the removal process, it is no longer necessary to perform the subsequent steps, thereby reducing waste of resources.

While some exemplary embodiments of the present disclosure have been given in the above description, it will be understood by those skilled in the art that modifications may be made to these exemplary embodiments without departing from the principle and spirit of the present disclosure, and the scope of the present disclosure is defined by the claims and their equivalents.

What is claimed is:

1. A method for manufacturing an array substrate, comprising:
    forming an inorganic layer on a base substrate;
    defining a preset region in a marginal region of the base substrate, and removing the inorganic layer in the preset region; and
    cutting the base substrate or the base substrate together with one or more layers on the base substrate in the preset region,
    wherein the method further comprises: sequentially forming a first polyimide alignment film, a first interfacial barrier layer, and a second polyimide alignment film on the base substrate by a sputtering or vapor deposition process before forming the inorganic layer on the base substrate.

2. The method according to claim 1, wherein the step of removing the inorganic layer in the preset region comprises:
    applying resist on the inorganic layer;
    exposing and developing the inorganic layer coated with the resist to remove the resist in the preset region; and
    etching the inorganic layer by using a mask formed by the resist remaining in a non-preset region, to remove the inorganic layer in the preset region.

3. The method according to claim 1, wherein the step of removing the inorganic layer in the preset region comprises:
    forming an insulation layer on the inorganic layer, and applying resist on the insulation layer;
    exposing and developing the insulation layer coated with the resist to remove the resist in the preset region; and
    sequentially etching the insulation layer and the inorganic layer by using a mask formed by the resist remaining in a non-preset region, to remove the inorganic layer in the preset region.

4. The method according to claim 1, wherein the step of removing the inorganic layer in the preset region comprises:
    sequentially forming an insulation layer and a thin film encapsulation layer on the inorganic layer, and applying resist on the thin film encapsulation layer;
    exposing and developing the thin film encapsulation layer coated with the resist to remove the resist in the preset region; and
    sequentially etching the thin film encapsulation layer, the insulation layer and the inorganic layer by using a mask formed by the resist remaining in a non-preset region, to remove the inorganic layer in the preset region.

5. The method according to claim 1, wherein the inorganic layer comprises a second interfacial barrier layer formed on the base substrate and a buffer layer formed on a side of the second interfacial barrier layer away from the base substrate.

6. The method according to claim 3, wherein the insulation layer comprises a plurality of barrier dams and an anti-cracking dam disposed at an end of the insulation layer, and a patterning process of the barrier dams and the anti-cracking dam and the removal of the inorganic layer in the preset region are accomplished by one same process.

7. The method according to claim 6, wherein the anti-cracking dam is located at an outer side of the plurality of barrier dams, and gaps are respectively provided between adjacent ones of the plurality of barrier dams and between the anti-cracking dam and the barrier dam adjacent thereto.

8. The method according to claim 7, wherein the preset region is a region between a boundary of the base substrate and a boundary of the anti-cracking dam.

9. The method according to claim 3, wherein the etching the insulation layer and the etching the inorganic layer are accomplished in a same process step; or
    wherein the etching the insulation layer and the etching the inorganic layer are accomplished in different process steps.

10. The method according to claim 4, wherein the etching the thin film encapsulation layer, the etching the insulation layer and the etching the inorganic layer are accomplished in a same process step; or
    wherein the etching the thin film encapsulation layer, the etching the insulation layer and the etching the inorganic layer are accomplished in different process steps.

11. The method according to claim 2, wherein the applying the resist on the inorganic layer comprises forming a resist layer having a uniform and flat upper surface by a spin coating process.

12. The method according to claim 11, wherein the resist is positive or negative resist.

13. The method according to claim 1, wherein the cutting the base substrate or the base substrate together with one or more layers on the base substrate comprises cutting the base substrate or the base substrate together with one or more layers on the base substrate by using laser.

14. The method according to claim 1, wherein the cutting the base substrate or the base substrate together with one or more layers on the base substrate comprises cutting the base substrate or the base substrate together with one or more layers on the base substrate along a new side edge of the inorganic layer formed after the inorganic layer in the preset region is removed.

15. The method according to claim 4, wherein the insulation layer comprises a plurality of barrier dams and an anti-cracking dam disposed at an end of the insulation layer, and a patterning process of the barrier dams and the anti-cracking dam and the removal of the inorganic layer in the preset region are accomplished by one same process.

16. The method according to claim 15, wherein the anti-cracking dam is located at an outer side of the plurality of barrier dams, and gaps are respectively provided between adjacent ones of the plurality of barrier dams and between the anti-cracking dam and the barrier dam adjacent thereto.

17. The method according to claim 16, wherein the preset region is a region between a boundary of the base substrate and a boundary of the anti-cracking dam.

18. An array substrate, manufactured by the method for manufacturing the array substrate according to claim 1.

19. A display panel, comprising the array substrate according to claim 18.

\* \* \* \* \*